United States Patent [19]

Iwasaki et al.

[11] Patent Number: 4,598,036

[45] Date of Patent: Jul. 1, 1986

[54] PRINT-OUT COMPOSITIONS

[75] Inventors: Masayuki Iwasaki; Minoru Maeda; Fumiaki Shinozaki, all of Shizuoka; Sadao Ishige, Kanagawa, all of Japan

[73] Assignee: Fuji Photo Film Co., Ltd., Kanagawa, Japan

[21] Appl. No.: 649,002

[22] Filed: Sep. 10, 1984

[30] Foreign Application Priority Data

Sep. 8, 1983 [JP] Japan .................. 58-165405

[51] Int. Cl.$^4$ .................. G03C 1/52; G03C 1/68
[52] U.S. Cl. .................. 430/270; 430/281; 430/285; 430/286; 430/191; 430/196; 430/344; 430/292; 430/342; 430/343; 430/338; 430/287
[58] Field of Search ............. 430/344, 292, 342, 343, 430/270, 281, 285, 286, 191, 196, 338, 287; 428/913; 346/218

[56] References Cited

U.S. PATENT DOCUMENTS

| | | | |
|---|---|---|---|
| 3,769,023 | 10/1973 | Lewis et al. | 430/942 |
| 3,957,288 | 5/1976 | Lemahieu et al. | 346/218 |
| 4,008,085 | 2/1977 | Lemahieu et al. | 430/344 |
| 4,154,463 | 5/1979 | Burri | 428/913 |
| 4,297,435 | 10/1981 | Jolly | 430/344 |
| 4,343,885 | 8/1982 | Reardon | 430/338 |
| 4,500,897 | 2/1985 | Matsuda et al. | 346/218 |

Primary Examiner—Won H. Louie
Attorney, Agent, or Firm—Sughrue, Mion, Zinn, Macpeak & Seas

[57] ABSTRACT

A print-out composition containing a leuco dye and a photooxidizing agent is described, said print-out composition containing at least one carbazomethane compound represented by formula (I) as the leuco dye

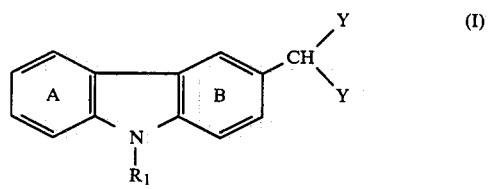

wherein Y represents an amino group-substituted phenyl group represented by formula (Ia)

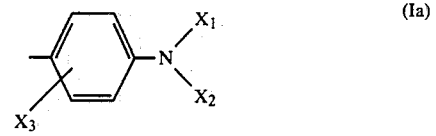

or an indolyl group represented by formula (Ib)

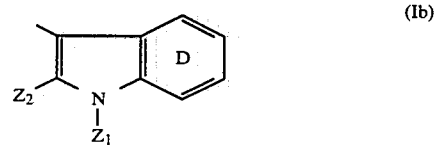

wherein $X_1$ and $X_2$ each represents a hydrogen atom, an unsubstituted alkyl group, or an alkyl group substituted by a halogen atom, a hydroxy group, a cyano group, or a lower alkoxy group, said alkyl group having up to 12 carbon atoms, a cycloalkyl group, a phenyl group, a benzyl group, or a phenyl or benzyl group substituted by a halogen atom, a lower alkyl group, or a lower alkoxy group, or said $X_1$ and $X_2$ together may form a 5-membered or 6-membered heterocyclic group together with the nitrogen atom bonded thereto; $X_3$ represents a hydrogen atom, a halogen atom, a nitro group, a lower alkyl group, or a lower alkoxy group; $R_1$ and $Z_1$ each represents a hydrogen atom, an unsubstituted alkyl group or an alkyl group substituted by a halogen atom having up to 12 carbon atoms, a hydroxy group, a cyano group, or a lower alkoxy group, an alkenyl group having up to 12 carbon atoms, an acyl group having from 1 to 12 carbon atoms, a phenyl group, a benzyl group, or a phenyl or benzyl group substituted by a member selected from the group consisting of a halogen atom, a lower alkyl group, a lower alkoxy group, and a nitro group; $Z_2$ represents a hydrogen atom, a lower alkyl group, or a phenyl group; and rings A, B, and D each may be further substituted by a cyano group, a nitro group, a halogen atom, a lower alkyl group, a lower alkoxy group, or a lower alkylcarbonyl group.

9 Claims, No Drawings

PRINT-OUT COMPOSITIONS

FIELD OF THE INVENTION

This invention relates to a print-out composition, and more particularly to a print-out composition having stability with the passage of time.

BACKGROUND OF THE INVENTION

Various compositions (print-out compositions) capable of being discolored by light exposure to be visually distinguishable in unexposed portions from exposed portions are known, as described, for example, in J. Kosar, *Light-Sensitive Systems*, pages 358–401, published by J. Wiley and Sons, New York, 1965.

Also, the important application fields of these compositions are light-sensitive lithographic printing plates, photoresists, etc., and hence it is very advantageous to be able to visually distinguish these portions before development after the image exposure. See Japanese Patent Application (OPI) No. 13780/80 corresponding to European Pat. No. 5380, 74728/79 corresponding to U.S. Pat. No. 4,232,106 and 8128/78 (the term "OPI" as used herein refers to a "published unexamined Japanese patent application").

That is, in the case of repeatedly printing out various originals by printing out a light-sensitive lithographic printing plate, a duplicated print-out on an already printed out portion can be prevented by using a print-out composition. Also, if a print-out composition is used for a photoresist for the production of a print base plate, it can be seen before development whether or not a photomask is correctly disposed, and the existence of any defects on the exposed portions can be easily determined.

Particularly effective print-out compositions are the compositions of organic polyhalogen compounds or other photooxidizing agents and various leuco dyes as disclosed, for example, in *Photogr. Sci. Eng.*, Vol. 5, pp. 98–103 (1961) and U.S. Pat. No. 3,042,515.

Such known compositions give a high color density and clear images but have a fault of being easily discolored by exposure to air (or oxygen). Thus, it has been attempted to add various antioxidants to overcome this fault (see, for example, U.S. Pat. Nos. 3,042,515 and 4,066,459 and Japanese Patent Application (OPI) No. 31581/81 corresponding to U.S. Pat. No. 3,827,887.

However, when these compositions with additives are stored for a long period of time, or are stored under conditions of high temperature and high humidity, the compositions still become discolored, and hence further improvement of such print-out compositions has been desired.

SUMMARY OF THE INVENTION

Accordingly, one object of this invention is to provide a print-out composition composed of a leuco dye and a photooxidizing agent having improved stability.

Another object of this invention is to provide a print-out composition composed of a leuco dye and a photooxidizing agent showing substantially the same performance as that before storage even after storing the composition for a long period of time under high temperature and high humidity conditions.

A further object of this invention is to provide a print-out composition composed of a combination of a leuco dye and a photooxidizing agent having excellent stability, capable of imparting an excellent print-out property when added to a light-sensitive resist-forming composition (due to a difference in solubility between the light-exposed portions and unexposed portions which is brought by exposing), which is used for the production of a light-sensitive lithographic printing plate or a photoresist, without reducing the photographic properties of the light-sensitive composition.

As a result of extensive investigations for attaining the above-described objects of this invention, the inventors have discovered that the aforesaid objects can be attained by using a carbazolylmethane compound represented by following formula (I) as the leuco dye in a composition comprising a leuco dye and a photooxidizing agent.

Formula (I) is

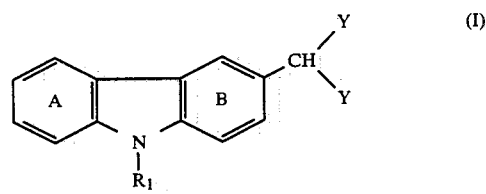

wherein Y represents an amino-substituted phenyl group represented by formula (Ia)

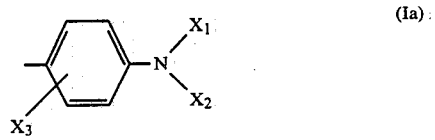

or an indolyl group represented by formula (Ib)

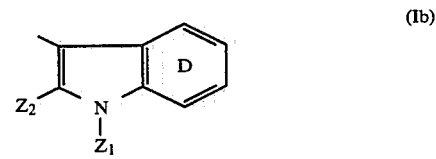

wherein $X_1$ and $X_2$ each represents a hydrogen atom, an unsubstituted alkyl group, or an alkyl group substituted by a halogen atom, a hydroxy group, a cyano group, or a lower alkoxy group, said alkyl group having up to 12 carbon atoms, a cycloalkyl group, a phenyl group, a benzyl group, or a phenyl or benzyl group substituted by a halogen atom, a lower alkyl group or a lower alkoxy group, or said $X_1$ and $X_2$ together may form a 5-membered or a 6-membered ring, particularly, a saturated heterocyclic ring, together with a nitrogen atom bonded thereto; $X_3$ represents a hydrogen atom, a halogen atom, a nitro group, a lower alkyl group, or a lower alkoxy group; $R_1$ and $Z_1$ each represents a hydrogen atom, an alkyl group, having up to 12 carbon atoms, unsubstituted or substituted by a member selected from the group consisting of a halogen atom, a hydroxy group, a cyano group, or a lower alkoxy group, an alkenyl group having up to 12 carbon atoms, an acyl group having from 1 to 12 carbon atoms, a phenyl group, a benzyl group, or a phenyl or benzyl group substituted by a member selected from the group consisting of a halogen atom, a lower alkyl group, a lower alkoxy group, or a nitro group; $Z_2$ represents a hydrogen atom, a lower alkyl group, or a phenyl group; and said rings A, B and D each may be further subsituted by a member selected from the group consisting of a cyano group, a nitro group, a halogen atom, a lower alkyl group, lower alkoxy group, or a lower alkyl carbonyl group. The lower alkyl group and the lower alkoxy group as a substituents on the phenyl group and the benzyl group represented by $X_1$, $X_2$, $R_1$ and $Z_1$, the lower alkoxy group as a substituent on the alkyl group represented by $X_1$, $X_2$, $R_1$ and $Z_1$, the lower alkyl group represented by $X_3$ and $Z_2$, the lower alkoxy group represented by $X_3$, and the lower alkyl group, the lower alkoxy group and the lower alkylcarbonyl group as a substituent on the rings A, B and D have 1 to 6 carbon atoms, respectively.

Examples of the preferred compounds represented by formula (I) for use in this invention are illustrated below as compound Nos. 1 to 14.

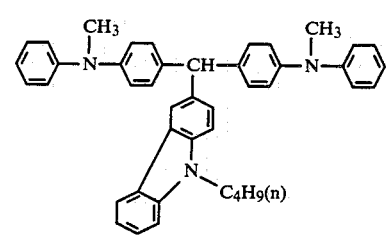
Compound No. 1

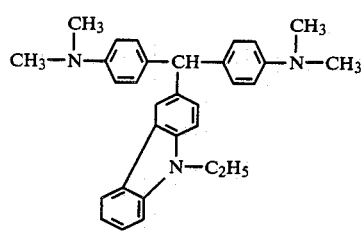
Compound No. 2

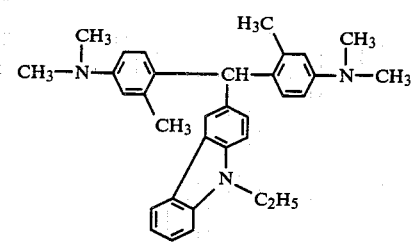
Compound No. 3

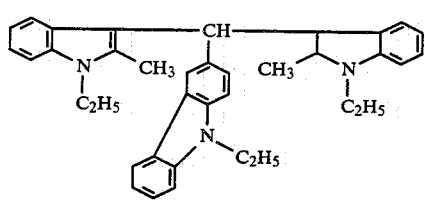
Compound No. 4

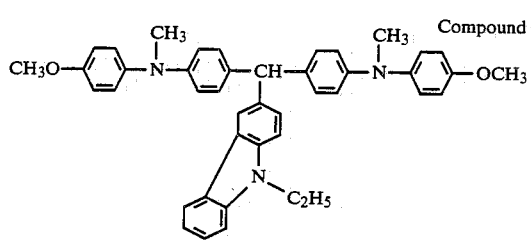
Compound No. 5

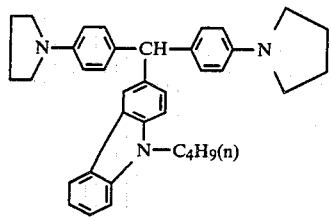
Compound No. 6

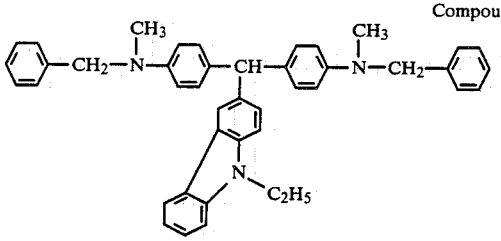
Compound No. 7

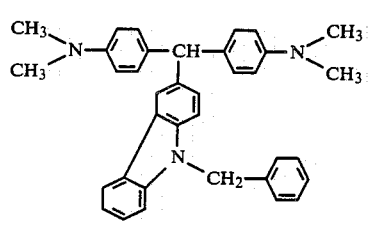
Compound No. 8

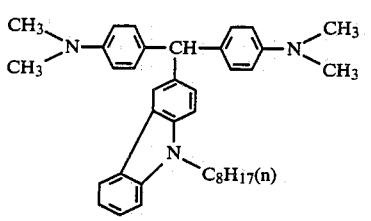
Compound No. 9

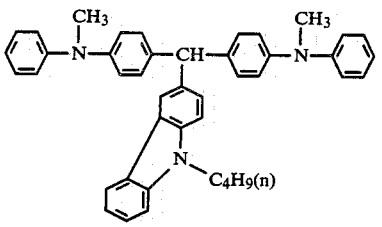
Compound No. 10

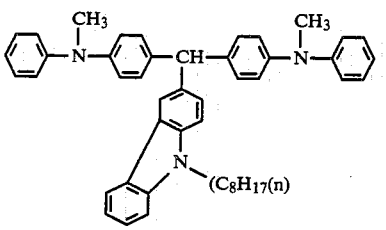
Compound No. 11

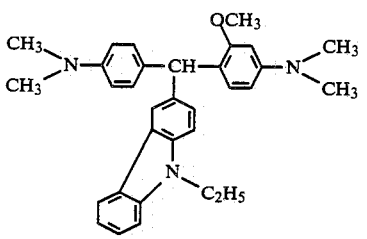
Compound No. 12

-continued

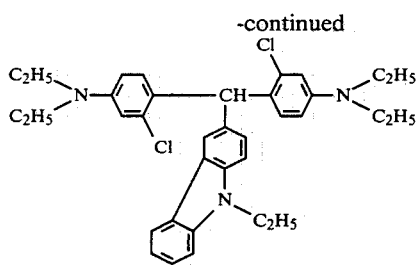
Compound No. 13

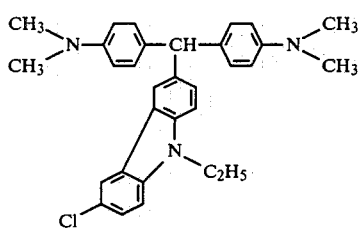
Compound No. 14

These compounds are all known, and synthesis methods therefor are described, for example, in Japanese Patent Applciation (OPI) No. 55223/78 corresponding to U.S. Pat. No. 4,154,463.

Preferred photooxidizing agents are inactive until they are exposed to actinic radiation, such as visible light, ultraviolet rays, infrared rays, X-rays, etc. Each photooxidizing agent has a different peak sensitivity, in various spectral regions, based on the structure of the compound. Therefore, a specific photooxidizing agent is activated depending upon the property of an actinic light. When the photooxidizing agent is exposed to such a radiation, the photooxidizing agent forms chemical species capable of oxidizing a leuco dye into the colored form.

Examples of typical photooxidizing agents are triaryl imidazolyl dimer as described in British Pat. No. 1,047,569; the halogenated hydrocarbons such as carbon tetrabromide, N-bromosuccinimide, tribromomethylphenylsulfone, etc., as described in U.S. Pat. Nos. 3,042,515 and 3,502,476; azide compounds such as 2-azidobenzoxazole, benzoylazide, 2-azidobenzimidazole, etc., as described in U.S. Pat. No. 3,282,693; and compounds such as 3-ethyl-1-methoxy-2-pyridothiacyanine perchlorate, 1-methoxy-2-methylpyridinium p-toluenesulfonate, etc., described in U.S. Pat. No. 3,615,568.

The print-out composition of this invention may further contain a binder and/or a light curing component in addition to the aforesaid leuco dye and photooxidizing agent.

Examples of the binder which can be added to the composition of this invention are synthetic high molecular weight compounds such as an acrylic resin, a styrene resin, polyamide, a polyester, polyurethane, polyvinyl alcohol, a vinyl ester resin, etc.; modified products of synthetic high molecular weight compounds such as polyvinyl formal, polyvinyl butyral, etc.; and natural macromolecular compounds such as cellulose, gelatin, etc., and the modified products of these natural macromolecular weight compounds.

Furthermore, the light curing component which can be added to the composition of this invention is a material which has a function as a binder, i.e., for binding a mixture of a leuco dye and a photooxidizing agent to a support and also has a function of forming a polymer image after light exposure and development.

It is known to utilize such a polymer image as a photoresist or an ink-receptive portion of a lithographic printing plate. In this case, a light-sensitive resist-forming composition capable of providing a printout image immediately by light exposure. As the light curing components suitable for such a purpose, materials as described below are known.

Examples of suitable light curing components include polyvinyl cinnamate described in U.S. Pat. No. 2,610,120; a polyester having a photosensitive group described in U.S. Pat. No. 3,030,208; an azido polymer (which acts as a photooxidizing agent) as described in Summary of the Lecture, at page 55, of the Spring Research Convention by Japan Photographic Society in 1968; a polymer having a cinnamylidenemalonic acid repeating unit as described in U.S. Pat. No. 3,674,745; and a light cross-linking type polymer as described in U.S. Pat. No. 3,929,489. Further examples include a photopolymerizable composition composed of an ethylenically unsaturated compound, an initiator, and a binder as described in Japanese Patent Publication 8495/60; a photopolymerizable composition composed of an unsaturated polyester, a cross-linking agent, and a photosensitizer as described in Japanese Patent Publication No. 19125/68 corresponding to U.S. Pat. No. 3,556,791; and the photopolymerizable composition composed of an ethylenically unsaturated compound, an initiator, a polymer having a free acid group on a side chain, and a protective layer component as described in Japanese Patent Publication No. 32714/71 corresponding to British Pat. No. 1,148,362.

The amount of the light curing component is preferably from about 1 to about 1,000 parts by weight, and most preferably from about 10 to about 200 parts by weight, per part by weight of leuco dye.

A solvent which is inactive with respect to the leuco dye, the photooxidizing agent, the binder and/or the light curing component is usually used for dissolving these compounds. These compounds are mixed with each other using the solvent to form a light-sensitive composition in a liquid medium and the liquid composition can be easily coated on a support.

Examples of the solvent which can be used for the composition of this invention include amides, such as formamide, N,N-dimethylformamide, N,N-dimethylacetamide, etc.; alcohols, such as methanol, ethanol, 1-propanol, 2-propanol, butanol, etc.; ketones, such as acetone, 2-butanone, etc.; esters, such as ethyl acetate, ethyl benzoate, etc.; ethers, such as tetrahydrofuran, dioxane, etc.; chlorinated aliphatic hydrocarbons, such as methylene chloride, ethylene chloride, dichloroethane, etc.; aromatic hydrocarbons, such as benzene, toluene, etc.; and other generally useful solvents, such as dimethyl sulfoxide, o-dichlorobenzene, dicyanodichlorobutane, 1-methyl-2-oxohexamethyleneimine, etc. They can be used solely or as a mixture thereof.

With respect to the preparation of the composition of this invention, preferred results are obtained by mixing the leuco dye and the photooxidizing agent in a ratio by weight of from about 10/1 to about 1/10. A very preferred ratio thereof is from 2/1 to 1/2. In the case of using a binder, the binder can be used in an amount of from about 0.5 to 100 parts by weight based on the total weight of the leuco dye and the photooxidizing agent.

When the composition of this invention is coated and dried, the thickness of the dry layer is generally from about 0.05 to about 100 microns, and is preferably from about 10 to about 100 microns (and can be fore) for a photoresist, and is preferably from about 0.1 to about 5.0 microns for light-sensitive lithographic printing plate.

For applying the composition of this invention to a support, the composition is coated on a support by a known method, such as a doctor coating, spray coating, brush coating, roller coating, dip coating, casting, taking up after dipping, etc. The light-sensitive element thus formed is dried at room temperature or under heating.

The element thus formed is exposed to a pattern of actinic radiation to form an image directly on the support. The light exposure is performed from an original having an image or by other known method by a contact printing method, a projection, reflection, or double reflection by lense or lenses.

The material for the support may be suitably selected from various materials which do not cause chemical reaction directly with the liquid coating composition. As the materials for the support, there are fiber base materials, such as papers, polyethylene-coated papers, polypropylene-coated papers, parchments, cloth, etc.; sheets or foils of metals such as aluminum, copper, magnesium, zinc, etc.; glass sheets or glass sheets coated with metals such as chromium, a chromium alloy, copper, silver, gold, platinum, etc.; and synthetic resins and polymer materials, such as poly(alkyl acrylate) (e.g., poly(methyl methacrylate)), polyester (e.g., poly(ethylene terephthalate), poly(vinylacetal), etc.), polyamide (e.g., nylon), and cellulose esters (e.g., cellulose nitrate, cellulose acetate, cellulose acetate propionate, cellulose acetate butyrate, etc.).

As a material for the support which is useful for making a dry film resist, there are polymers such as polyester and polycarbonate.

As the support materials useful for making printing plates, and in particular lithographic printing plates, there are zinc, aluminum subjected to an electrolytic treatment, aluminum subjected to grinding, copper, and specifically treated metal or paper; cellulose ester films the surface of which is subjected to a hydrolytic treatment; and supports of polymers, such as polyolefin, polyester, polyamide, etc.

Such a support may be previously coated with a subbing layer, prior to coating with the light-sensitive composition of this invention, by a copolymer of vinylidene chloride and an acrylic monomer (e.g., acrylonitrile, methyl acrylate, etc.); and unsaturated dicarboxylic acids (e.g., itaconic acid, etc.); carboxymethyl cellulose; gelatin; polyacrylamide; and the like.

The support may have a filter layer composed of a colored polymer layer or an antihalation layer for absorbing exposure radiation after passing through the radiation-sensitive layer or preventing the undesirable reflection from the support.

A yellow dye in a polymer binding described above is particularly useful as the antihalation layer when ultraviolet radiation is used as a light source for image exposure.

When the composition contains a light-curing component, after imagewise exposing the coated layer of the composition to an actinic radiation, the radiation-sensitive layer can be developed by performing flushing, soaking, swabbing etc., using a solution capable of selectively dissolving non-exposed portions of the radiation-sensitive layer after exposure (such a solution is referred to as developer).

The main advantageous point of this invention is the provision of a stable printing-out composition which is not disclosed with the passage of time, and particularly the provision of a print-out composition which has very excellent stability even under high temperature and high humidity conditions.

The invention is explained in further detail by the following examples, but the invention is not limited to the embodiments described in these examples.

EXAMPLES 1 TO 4 AND COMPARISON EXAMPLE 1

The following liquid coating compositions containing various leuco dyes as shown in Table 1 and other common components as shown below were prepared.

| | |
|---|---|
| Poly(methyl methacrylate) (mean molecular weight: 140,000) | 15 g |
| Trimethylolpropane Triacrylate | 2.4 g |
| Tetraethylene Glycol Diacrylate | 6.1 g |
| p,p'-(N,N—Diethylamino)benzophenone | 0.04 g |
| Benzophenone | 0.45 g |
| Phenyltribromomethylsulfone | 0.37 g |
| p-Methoxyphenol | 0.01 g |
| p-Toluenesulfonamide | 1.62 g |
| Malachite Green | 0.023 g |
| Leuco Dye | x g |
| Methyl Ethyl Ketone | 45 g |

Each of the liquid coating composition was coated on a polyethylene terephthalate film of 25 microns in thickness and dried for 2 minutes in an oven at 100° C. to form a coated layer of about 50 microns in thickness. Then, the film was superposed on a copper-coated laminate plate at 120° C., a transparent film having a pattern for print wiring was superposed thereon, and then the system was exposed to a high pressure mercury lamp of 2 kw (Jet Printer, made by Orc K.K.) at 10 counts under reduced pressure.

A print-out image composed of a light green unexposed portion and a blue exposed portion was formed on each of the laminate plates. After peeling off the polyethylene terephthalate film from the exposed laminate plate, the plate was immersed in 1,1,1-trichloroethane for 60 seconds to dissolve off the unexposed portion, whereby a clear photoresist image was obtained on the copper surface.

Apart from this, a polyethylene film of 25 microns was disposed on the unexposed layer of 50 microns in thickness formed on the polyethylene terephthalate film formed as described above by means of a laminator. One of the sandwiched laminates thus formed was ripened for 7 days under the conditions of 75% relative humidity and a temperature of 45° C., as was another one which had not been ripened. After peeling off the polyethylene film from each of the ripened laminate and the unripened laminate, the laminate was disposed on a copper-coated plate as described above and the system was image-exposed in the same manner as described above to provide a print-out image. Then by measuring each image at a transmission density of 620 nm, the contrast (the difference in transmission density between the exposed portion and the unexposed portion) of the image before and after ripening and also the fog (the density of background) after ripening were measured. The results thus obtained are shown in Table 1.

TABLE 1

| Example No. | Leuco Dye Kind | Amount x (g) | Contrast before Ripening | Property after Ripening Fog | Contrast |
| --- | --- | --- | --- | --- | --- |
| 1 | Compound No. 1 | 0.32 | 0.29 | 0.03 | 0.27 |
| 2 | Compound No. 2 | 0.32 | 0.52 | 0.05 | 0.30 |
| 3 | Compound No. 3 | 0.32 | 0.48 | 0.02 | 0.26 |
| 4 | Compound No. 4 | 0.32 | 0.21 | 0.04 | 0.18 |
| Comparison Example 1 | (A)* | 0.08 | 0.36 | 0.20 | 0.05 |

(A)*: Leuco Crystal Violet

As is clear from the results shown in Table 1, it can be seen that in the case of using the compositions of this invention, the contrast of the images was high and the fog formation was low even after ripening, while in the case of using the known Leuco Crystal Violet, the image was colored (purple) showing high fog, and the contrast of the image was low after ripening.

That is, it can be seen that the compositions of this invention have excellent stability with the passage of time as compared to a conventional composition.

EXAMPLES 5 TO 8 AND COMPARISON EXAMPLE 2

Liquid coating compositions containing various leuco dyes as shown in Table 2 and other common components as shown below were prepared.

| | |
| --- | --- |
| Light-sensitive poylester (mean molecular weight of about 800) obtained by the poyl-condensation of an equimolar amount of diethyl p-phenylene diacrylate and 1,4-di-β-hydroxyethoxychlorohexane | 20 g |
| 2-(Benzoylmethylidene)-3-methyl-naphtho-[1,2-d]thiazoline | 1.2 g |
| Dioctyl Phthalate | 4.0 g |
| Leuco Dye | y g |
| 2,4-Bis(trichloromethyl)-6-(p-methoxy-styryl)-s-triazine | 0.2 g |
| Dichloroethane | 200 ml |
| Monochlorobenzene | 400 ml |

Each of the liquid coating compositions was rotary-coated on an aluminum plate, the surface of which was subjected to an electrolytic treatment, at a rotary speed of 200 rpm and dried for 2 minutes at 100° C. The thickness of the light-sensitive layer thus formed in each case was about 1.5 microns. After ripening each plate under the conditions of 75% relative humidity and a temperature of 45° C., the fog density was measured using a Macbeth reflection densitometer. Also, each of the ripened plates and unripened plates was image-exposed, and the contrast (the difference in reflection density between the unexposed portion and the exposed portion) of the image thus formed was measured. The results thus obtained are shown in Table 2.

TABLE 2

| Example No. | Leuco Dye Kind | Amount y (g) | Contrast before Ripening | Property after Ripening Fog | Contrast |
| --- | --- | --- | --- | --- | --- |
| 5 | Compound No. 1 | 1.6 | 0.10 | 0.02 | 0.09 |
| 6 | Compound No. 2 | 1.6 | 0.17 | 0.02 | 0.16 |
| 7 | Compound No. 3 | 1.6 | 0.16 | 0.02 | 0.14 |
| 8 | Compound No. 4 | 1.6 | 0.09 | 0.01 | 0.08 |
| Comparison Example 2 | (A)* | 0.4 | 0.12 | 0.06 | 0.05 |

(A)*: Leuco Crystal Violet

From the results shown in Table 2, it can be seen that in Examples 5 to 8 using the compositions of this invention, the contrast of the image was high and the formation of fog was less even ripening, while in Comparison Example 2 using the known leuco dye, the contrast of the image was lowered and the formation of fog was higher after ripening.

From these results, it can be seen that the compositions of this invention have excellent stability with the passage of time.

While the invention has been described in detail and with reference to specific embodiments thereof, it will be apparent to one skilled in the art that various changes and modifications can be made therein without departing from the spirit and scope thereof.

What is claimed is:

1. A print-out composition containing a leuco dye, a photooxidizing agent and a light curing component, said leuco dye being at least one carbazomethane compound represented by formula (I)

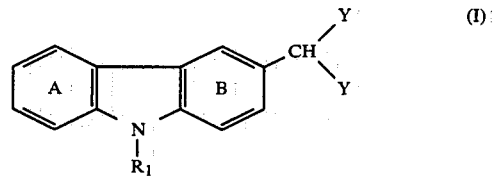

wherein Y represents an amino group-substituted phenyl group represented by formula (Ia)

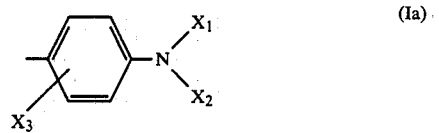

or an indolyl group represented by formula (Ib)

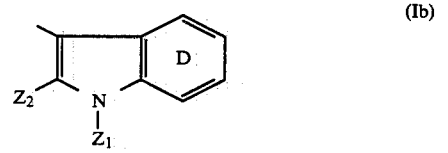

wherein $X_1$ and $X_2$ each represents a hydrogen atom, an unsubstituted alkyl group, or an alkyl group substituted by a halogen atom, a hydroxy group, a cyano group, or a lower alkoxy group, said alkyl group having up to 12 carbon atoms, a cycloalkyl group, a phenyl group, a benzyl group, or a phenyl or benzyl group substituted by a halogen atom, a lower alkyl group, or a lower alkoxy group, or said $X_1$ and $X_2$ together may form a 5-membered or 6-membered heterocyclic group together with the nitrogen atom bonded thereto; $X_3$ represents a hydrogen atom, a halogen atom, a nitro group, a lower alkyl group, or a lower alkoxy group; $R_1$ and $Z_1$ each represents a hydrogen atom, an alkyl group having up to 12 carbon atoms unsubstituted or substituted by a halogen atom, a hydroxy group, a cyano group, or a lower alkoxy group, an alkenyl group having up to 12 carbon atoms, an acyl group having from 1 to 12 carbon atoms, a phenyl group, a benzyl group, or a phenyl or benzyl group substituted by a member selected from the group consisting of a halogen atom, a lower alkyl group, a lower alkoxy group, and a nitro group; $Z_2$ represents a hydrogen atom, a lower alkyl group, or a phenyl group; and rings A, B, and D each may be further substituted by a cyano group, a nitro group, a halogen atom, a lower alkyl group, a lower alkoxy group, or a lower alkylcarbonyl group.

2. A print-out composition as in claim 1, further containing a binder.

3. A print-out composition as in claim 1, wherein the leuco dye and the photooxidizing agent are used in a ratio by weight of from about 10/1 to about 1/10.

4. A print-out composition as in claim 2, wherein the leuco dye and the photooxidizing agent are used in a ratio by weight of from about 10/1 to about 1/10.

5. A print-out composition as in claim 1, wherein the leuco dye and the photooxidizing agent are used in a ratio by weight of from about 2/1 to about 1/2.

6. A print-out composition as in claim 2, wherein the leuco dye and the photooxidizing agent are used in a ratio by weight of from about 2/1 to about 1/2.

7. A print-out composition as in claim 1, wherein the amount of the light curing component is from about 1 to about 1,000 parts by weight per part by weight of leuco dye.

8. A print-out composition as in claim 1, wherein the amount of the light curing component is from about 10 to about 200 parts by weight per part by weight of leuco dye.

9. A print-out composition as in claim 2, wherein the binder is used in an amount of from about 0.5 to 100 parts by weight based on the total weight of the leuco dye and the photooxidizing agent.

* * * * *